(12) United States Patent
Wu et al.

(10) Patent No.: US 9,015,551 B2
(45) Date of Patent: Apr. 21, 2015

(54) DECODING APPARATUS WITH DE-INTERLEAVING EFFORTS DISTRIBUTED TO DIFFERENT DECODING PHASES AND RELATED DECODING METHOD THEREOF

(71) Applicant: MediaTek Inc., Hsin-Chu (TW)

(72) Inventors: Wei-De Wu, Hsinchu (TW); Chiaming Lo, Tustin, CA (US)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 192 days.

(21) Appl. No.: 13/798,112

(22) Filed: Mar. 13, 2013

(65) Prior Publication Data

US 2013/0283120 A1  Oct. 24, 2013

Related U.S. Application Data

(60) Provisional application No. 61/635,303, filed on Apr. 19, 2012, provisional application No. 61/648,059, filed on May 16, 2012.

(51) Int. Cl.
H03M 13/00 (2006.01)
H03M 13/27 (2006.01)
H03M 13/29 (2006.01)
H03M 13/39 (2006.01)

(52) U.S. Cl.
CPC ........ *H03M 13/2778* (2013.01); *H03M 13/271* (2013.01); *H03M 13/2775* (2013.01); *H03M 13/2957* (2013.01); *H03M 13/3905* (2013.01); *H03M 13/3972* (2013.01); *H03M 13/2714* (2013.01)

(58) Field of Classification Search
CPC .......... H03M 13/271; H03M 13/2775; H03M 13/2796; H03M 13/2957
USPC ............. 714/701–702, 746, 755, 786; 341/81
See application file for complete search history.

(56) References Cited

U.S. PATENT DOCUMENTS

| | | | |
|---|---|---|---|
| 6,392,572 B1 * | 5/2002 | Shiu et al. ........................ | 341/81 |
| 7,210,076 B2 * | 4/2007 | Maru ............................ | 714/702 |
| 7,667,628 B2 * | 2/2010 | Breiling ......................... | 341/81 |
| 7,698,620 B2 * | 4/2010 | Ishida ........................... | 714/755 |
| 8,495,455 B1 * | 7/2013 | Zhang et al. .................. | 714/755 |
| 2012/0066566 A1 | 3/2012 | Cui | |

* cited by examiner

*Primary Examiner* — Shelly A Chase
(74) *Attorney, Agent, or Firm* — Winston Hsu; Scott Margo

(57) ABSTRACT

A decoding apparatus includes a memory device and a decoding circuit. The memory device is arranged for storing a data block with inter-row interleaving in a plurality of data rows of the data block and without intra-row interleaving in each of the data rows. The decoding circuit is coupled to the memory device. The decoding circuit is arranged for accessing the memory device to perform a first decoding operation with inter-row de-interleaving memory access, and accessing the memory device to perform a second decoding operation with intra-row de-interleaving memory access.

22 Claims, 12 Drawing Sheets

| Row 0 | Row 1 | Row 2 | Row 3 | Row 4 |
|---|---|---|---|---|
| Bank 4 | Bank 5 | Bank 5 | Bank 3 | Bank 3 |

| Row 8 | Row 9 | Row 10 | Row 11 | Row 12 |
|---|---|---|---|---|
| Bank 8 | Bank 1 | Bank 9 | Bank 7 | Bank 8 |

502

Decoder core (114_1)

Decoder core (114_3)

| Row 8 | Row 7 | Row 6 | Row 5 | Row 4 |
|---|---|---|---|---|
| Bank 8 | Bank 7 | Bank 6 | Bank 6 | Bank 3 |

| Row 17 | Row 16 | Row 15 | Row 14 | Row 13 |
|---|---|---|---|---|
| Bank 2 | Bank 0 | Bank 3 | Bank 2 | Bank 1 |

504

Decoder core (114_2)

Decoder core (114_4)

FIG. 7

| Decoder core (114_1) | Row 0 | Row 1 | Row 2 | Row 3 | Row 4 |
|---|---|---|---|---|---|
| | Bank 3 | Bank 5 | Bank 5 | Bank 4 | Bank 4 |

| Decoder core (114_2) | Row 8 | Row 7 | Row 6 | Row 5 | Row 4 |
|---|---|---|---|---|---|
| | Bank 8 | Bank 7 | Bank 6 | Bank 6 | Bank 3 |

502, 504

| Decoder core (114_3) | Row 8 | Row 9 | Row 10 | Row 11 | Row 12 |
|---|---|---|---|---|---|
| | Bank 8 | Bank 1 | Bank 9 | Bank 7 | Bank 8 |

| Decoder core (114_4) | Row 17 | Row 16 | Row 15 | Row 14 | Row 13 |
|---|---|---|---|---|---|
| | Bank 2 | Bank 0 | Bank 3 | Bank 2 | Bank 1 |

FIG. 8

| Row 0 | Row 1 | Row 2 | Row 3 | Row 4 |
|---|---|---|---|---|
| Bank 4 | Bank 5 | Bank 5 | Bank 4 | Bank 3 |

Decoder core (114_1)

502

| Row 8 | Row 9 | Row 10 | Row 11 | Row 12 |
|---|---|---|---|---|
| Bank 1 | Bank 1 | Bank 0 | Bank 9 | Bank 8 |

Decoder core (114_3)

| Row 8 | Row 7 | Row 6 | Row 5 | Row 4 |
|---|---|---|---|---|
| Bank 1 | Bank 7 | Bank 7 | Bank 6 | Bank 3 |

Decoder core (114_2)

504

| Row 17 | Row 16 | Row 15 | Row 14 | Row 13 |
|---|---|---|---|---|
| Bank 3 | Bank 6 | Bank 8 | Bank 2 | Bank 2 |

Decoder core (114_4)

Decoder core (114_1) — 502:
| Row 0 | Row 1 | Row 2 | Row 3 | Row 4 |
|---|---|---|---|---|
| Bank 4 | Bank 6 | Bank 5 | Bank 4 | Bank 3 |

| Row 8 | Row 9 | Row 10 | Row 11 | Row 12 |
|---|---|---|---|---|
| Bank 1 | Bank 1 | Bank 0 | Bank 9 | Bank 8 |

Decoder core (114_3)

Decoder core (114_2) — 504:
| Row 8 | Row 7 | Row 6 | Row 5 | Row 4 |
|---|---|---|---|---|
| Bank 1 | Bank 7 | Bank 7 | Bank 6 | Bank 3 |

| Row 17 | Row 16 | Row 15 | Row 14 | Row 13 |
|---|---|---|---|---|
| Bank 3 | Bank 5 | Bank 8 | Bank 2 | Bank 2 |

Decoder core (114_4)

DECODING APPARATUS WITH DE-INTERLEAVING EFFORTS DISTRIBUTED TO DIFFERENT DECODING PHASES AND RELATED DECODING METHOD THEREOF

CROSS REFERENCE TO RELATED APPLICATIONS

This application claims the benefit of U.S. provisional application No. 61/635,303 (filed on Apr. 19, 2012) and U.S. provisional application No. 61/648,059 (filed on May 16, 2012). The entire contents of the related applications are incorporated herein by reference.

BACKGROUND

The disclosed embodiments of the present invention relate to a decoding scheme, and more particularly, to a decoding apparatus with de-interleaving efforts distributed to different decoding phases (e.g., a linear/sequential decoding phase and an interleaved decoding phase) and related decoding method thereof.

Data signals, in particular those transmitted over a typically hostile channel, are susceptible to channel noise/interference. Various methods of error correction coding have been developed in order to minimize the adverse effects that a hostile channel has on the integrity of the transmitted data. This is also referred to as lowering the bit error rate (BER), which is generally defined as the ratio of incorrectly received information bits to the total number of received information bits. Error correction coding generally involves representing digital data in ways designed to be robust with respect to error bits. Hence, error correction coding may enable a communications system to recover original data from a signal that has been corrupted due to the undesired channel noise/interference.

For example, turbo codes may be used in the communications system, such as a Wideband Code Division Multiple Access (W-CDMA) system, for channel coding. Regarding the turbo coding system, the input data of a data block may be rearranged with an interleaver and then encoded with the same method as that applied to the original input data. In this way, the data block is encoded with a particular coding method, resulting in an encoded data having systematic bits and two sets of parity bits included therein. The encoded data is combined in some manner to form a serial bit stream and transmitted from a turbo encoding apparatus at a transmitter end to a turbo decoding apparatus at a receiver end through the channel. In general, a conventional turbo decoding apparatus uses an iterative algorithm between two soft-input soft-output (SISO) decoders, and therefore exchanges information between the SISO decoders in order to improve error correction performance.

To achieve a higher transmitted data rate, a possible solution is to apply parallel processing for turbo code decoding. For example, the turbo decoding apparatus may use SISO decoders, each having multiple decoder cores, for processing codeword segments simultaneously, thus providing a higher throughput without increasing the clock speed. However, the decoding performance of such a turbo decoding apparatus may be heavily affected by the interleaver design. Regarding a third generation (3G) communications system (e.g., W-CDMA system), a rectangular interleaver with inter-row permutation and intra-row permutation is employed by the turbo decoding apparatus. However, the rectangular interleaver is particularly designed for rich randomness without considering the multi-core turbo decoder implementation at that time. In other words, this parallel processing approach raises a memory contention problem caused by multiple accesses of the same memory bank in a memory device. For example, data bits of a data block to be decoded are sequentially stored into a memory device. Specifically, the data block to be decoded is stored in the memory device without inter-row permutation and intra-row permutation applied thereto. Hence, data bits of the data block to be decoded are stored in memory banks of the memory device in an original successive bit sequence. Regarding the conventional turbo decoder design, a first SISO decoder is arranged to refer to first parity bits of the data block to perform a decoding operation without inter-row de-interleaving and intra-row de-interleaving memory accesses due to the fact that the first parity bits are derived from the non-interleaved input data. However, regarding a second SISO decoder of the decoding apparatus, it is required to refer to second parity bits to perform a decoding operation with inter-row de-interleaving and intra-row de-interleaving memory accesses due to the fact that the second parity bits are derived from an interleaved input data. Hence, when the second SISO decoder is implemented using a multi-core decoder, it is possible that multiple decoder cores may request the desired data bits to be decoded from the same memory bank, which results in memory contention. When the memory contention occurs, only one decoder core is allowed to fetch the requested data bits from a target memory bank, and the remaining decoder cores need to wait. As a result, before the requested data bits are available, the decoding operation performed by the remaining decoder cores is stalled.

In view of the foregoing, there is a need for an innovative contention-free memory access for realizing a high-throughput multi-core turbo decoding apparatus.

SUMMARY

In accordance with exemplary embodiments of the present invention, a decoding apparatus with de-interleaving efforts distributed to different decoding phases (e.g., a linear/sequential decoding phase and an interleaved decoding phase) and related decoding method thereof are proposed, to solve the above-mentioned problem.

According to a first aspect of the present invention, an exemplary decoding apparatus is disclosed. The exemplary decoding apparatus includes a memory device and a decoding circuit. The memory device is arranged for storing a data block with inter-row interleaving in a plurality of data rows of the data block and without intra-row interleaving in each of the data rows. The decoding circuit is coupled to the memory device. The decoding circuit is arranged for accessing the memory device to perform a first decoding operation with inter-row de-interleaving memory access, and accessing the memory device to perform a second decoding operation with intra-row de-interleaving memory access.

According to a second aspect of the present invention, an exemplary decoding method is disclosed. The exemplary decoding method includes the following steps: utilizing a memory device to store a data block with inter-row interleaving in a plurality of data rows of the data block and without intra-row interleaving in each of the data rows; performing a first decoding operation with inter-row de-interleaving memory access by accessing the memory device; and performing a second decoding operation with intra-row de-interleaving memory access by accessing the memory device.

These and other objectives of the present invention will no doubt become obvious to those of ordinary skill in the art after

BRIEF DESCRIPTION OF THE DRAWINGS

FIG. 7 is a diagram illustrating the relation between data rows and memory banks according to a first embodiment of the present invention.

FIG. 8 is a diagram illustrating the relation between data rows and memory banks according to a second embodiment of the present invention.

FIG. 9 is a diagram illustrating the relation between data rows and memory banks according to a third embodiment of the present invention.

FIG. 10 is a diagram illustrating the relation between data rows and memory banks according to a fourth embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The concept of the present invention is to employ interleaved memory arrangement and proper memory access scheduling of decoder cores to thereby avoid/mitigate the memory contention problem. Specifically, due to the interleaved memory arrangement, a balanced de-interleaving design for a decoding circuit, having multiple decoder cores and operating in different decoding phases, is provided such that the decoding circuit operating in one decoding phase and the decoding circuit operating in another decoding phase would share the de-interleaving efforts. With the help of the balanced de-interleaving design as proposed in the present invention, the contention-free memory access for multiple decoder cores can be achieved through proper memory access scheduling. Further description is detailed as below.

Figure 1:
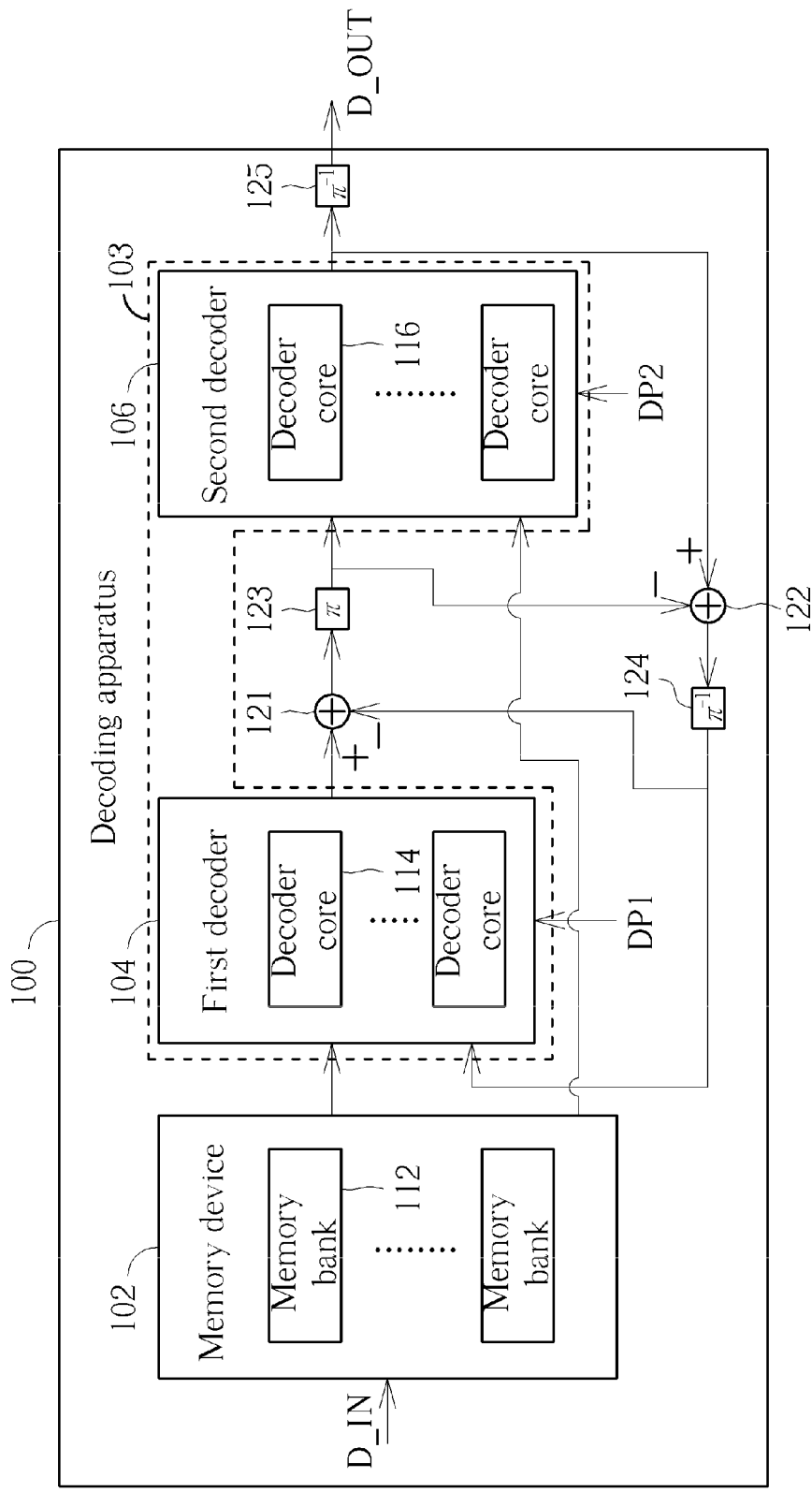
FIG. 1 is a block diagram illustrating a decoding apparatus according to a first embodiment of the present invention.

FIG. 1 is a block diagram illustrating a decoding apparatus according to a first embodiment of the present invention. The exemplary decoding apparatus 100 may be a turbo decoding apparatus used for a 3 G communications system, such as a W-CDMA system. However, this is for illustrative purposes only. In practice, any decoder architecture employing the proposed techniques for achieving a contention-free memory access falls within the scope of the present invention. As shown in FIG. 1, the decoding apparatus 100 includes a memory device 102 and a decoding circuit 103. In a logic sense, the decoding circuit 103 may be regarded as having a plurality of decoders (e.g., SISO decoders) including at least a first decoder 104 and a second decoder 106. In a physical sense, the decoding circuit 103 may employ a hardware sharing technique to make a single decoder with multiple decoder cores operate in a time-division manner. More specifically, when the decoding circuit 103 operates in a linear/sequential decoding phase, the single decoder with multiple decoder cores (i.e., the first decoder 104) is operative; and when the decoding circuit 103 operates in an interleaved decoding phase, the same single decoder with multiple decoder cores (i.e., the first decoder 104) is operative to act as the second decoder 106. However, this is for illustrative purposes only, and is not meant to be a limitation of the present invention. That is, implementing the decoding circuit 103 with two sets of decoder cores may also fall within the scope of the present invention.

The memory device 102 serves as a systematic information memory. Hence, the memory device 102 is used to buffer a data block D_IN composed of data bits (e.g., soft decisions/ soft bits corresponding to systematic bits), and includes a plurality of memory banks 112. Each of the first decoder 104 (e.g., a single decoder operating in the linear/sequential decoding phase) and the second decoder 106 (e.g., the single decoder operating in the interleaved decoding phase) is a multi-core decoder used for parallel decoding of multiple codeword segments. Therefore, the first decoder 104 includes a plurality of decoder cores 114, and the second decoder 106 also includes a plurality of decoder cores 116, where each decoder core is responsible for successively decoding multiple codeword segments in multiple cycles when granted to fetch soft bits of these codeword segments in one cycle under the proposed memory access scheduling. Details of the proposed memory access scheduling will be described later. It should be noted that the number of memory banks 122, the number of decoder cores 114 and/or the number of decoder cores 116 may be adjusted, depending upon actual design requirement/consideration.

As the decoding apparatus 100 is a turbo decoding apparatus in this embodiment, there are adders 121, 122 used for getting extrinsic information. In addition, interleaver 123 and de-interleavers 124, 125 are also included in the decoding apparatus 100, where an output of the de-interleaver 125 acts as a decoded data block D_OUT composed of decoded data bits. For the first decoding iteration, the soft decisions (soft bits) corresponding to systematic bits and the soft decisions (soft bits) corresponding to the first parity bits DP1 are used by the first decoder 104 in order to decode a first constituent code. The first decoder 104 outputs the Log Likelihood Ratios (LLRs) of the transmitted bits, and they are used to help the decoding performed by the second decoder 106. However, they cannot be used directly and need to be processed so that they are in a format suitable to be fed into the second decoder 106. First, extrinsic values are obtained at the adder 121 and then interleaved at the interleaver 123, in order to replicate the interleaving applied at the transmitter end on the sequence of bits to be encoded. The decoding performed by the second decoder 106 uses the extrinsic information generated by first decoder 104 with the soft decisions (soft bits) corresponding to interleaved systematic bits and the soft decisions (soft bits) corresponding to the second parity bits DP2. At the output of the second decoder 106, a new sequence of LLRs is generated for the sequence of transmitted bits. The LLRs are used by the adder 122 to calculate the extrinsic information generated by the second decoder 106. After de-interleaving at the de-interleaver 124, this extrinsic information can be used, in subsequent decoding iterations, by the first decoder 104.

As mentioned above, each of the first decoder 104 and the second decoder 106 needs to fetch soft decisions (soft bits) corresponding to systematic bits from the memory device 102. Hence, to avoid multiple decoder cores 114/116 of the same decoder 104/106 from contending for memory access of the memory device 102, data bits (e.g., soft bits) of the data block D_IN are stored in the memory device 102 with a proposed interleaved arrangement. Specifically, the memory device 102 is arranged for storing the data block D_IN with inter-row interleaving in a plurality of data rows of the data block D_IN and without intra-row interleaving in each of the data rows.

Figure 11:
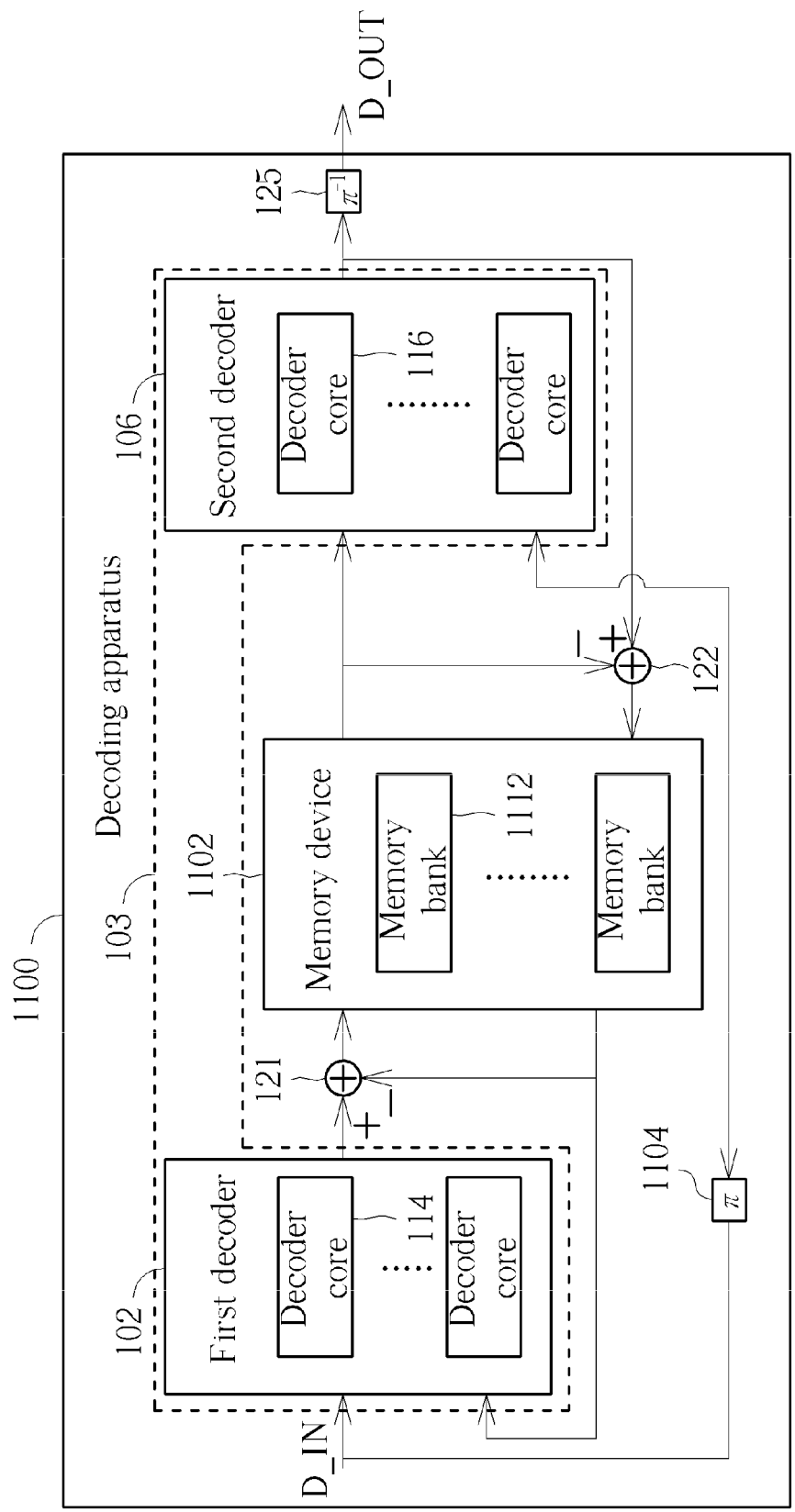
FIG. 11 is a block diagram illustrating a decoding apparatus according to a second embodiment of the present invention.

As shown in FIG. 1, the proposed memory arrangement is applied to the memory device 102, which serves as a systematic information memory used to buffer the data block D_IN composed of data bits (e.g., soft decisions/soft bits corresponding to systematic bits). However, the proposed memory arrangement may be applied to an extrinsic information memory. Please refer to FIG. 11, which is a block diagram illustrating a decoding apparatus according to a second embodiment of the present invention. The major difference between the decoding apparatuses 1100 and 100 is that the decoding apparatus 1100 has a memory device 1102 serving as an extrinsic information memory, where the memory device 1102 is used to buffer a data block composed of data bits (e.g., extrinsic information generated from the adders 121 and 122). Thus, an output of the interleaver 123 in FIG. 1 is now read from the memory device 1102 having the proposed interleaved memory arrangement, and an output of the de-interleaver 124 in FIG. 1 is now read from the memory device 1102 having the proposed interleaved memory arrangement. In this embodiment, regarding the data block D_IN composed of data bits (e.g., soft decisions/soft bits corresponding to systematic bits), it is transmitted to the first decoder 102 and the second decoder 106 in a conventional manner, where an interleaver 1104 is implemented to provide interleaved soft decisions/soft bits to the second decoder 106.

Figure 12:
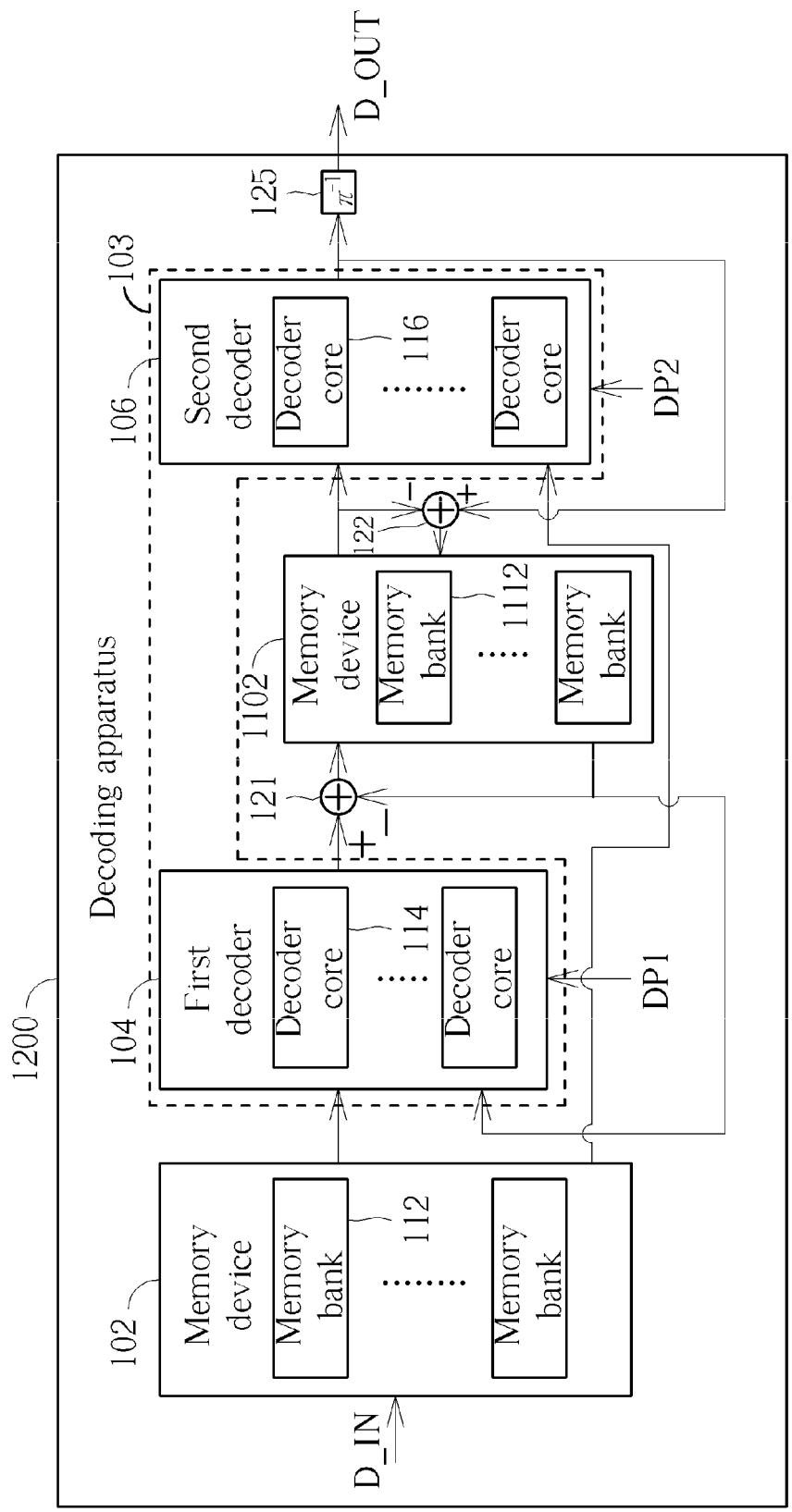
FIG. 12 is a block diagram illustrating a decoding apparatus according to a third embodiment of the present invention.

In a preferred embodiment, the proposed memory arrangement is applied to the memory device 102, which serves as a systematic information memory used to buffer the data block D_IN composed of data bits (e.g., soft decisions/soft bits corresponding to systematic bits), and is also applied to the memory device 1102, which serves as an extrinsic information memory used to buffer the data block composed of data bits (e.g., extrinsic information). Please refer to FIG. 12, which is a block diagram illustrating a decoding apparatus according to a third embodiment of the present invention. Compared to the aforementioned decoding apparatuses 100 and 1100, the decoding apparatus 1200 would have better decoding performance due to contention-free memory access of the systematic soft decisions/soft bits and the extrinsic information.

A person skilled in the art should readily understand technical features of the interleaved memory arrangement of the memory device 1102 and the associated memory access scheduling of decoder cores to access extrinsic information from the memory device 1102 after reading the description directed to the interleaved memory arrangement of the memory device 102 and the associated memory access scheduling of decoder cores to access systematic soft decisions/soft bits from the memory device 102. Thus, for clarity and simplicity, the following description is only directed to the interleaved memory arrangement of the memory device 102 and the associated memory access scheduling of decoder cores to access the memory device 102. Further description directed to the interleaved memory arrangement of the memory device 1102 and the associated memory access scheduling of decoder cores to access the memory device 1102 is therefore omitted for brevity.

Figure 2:
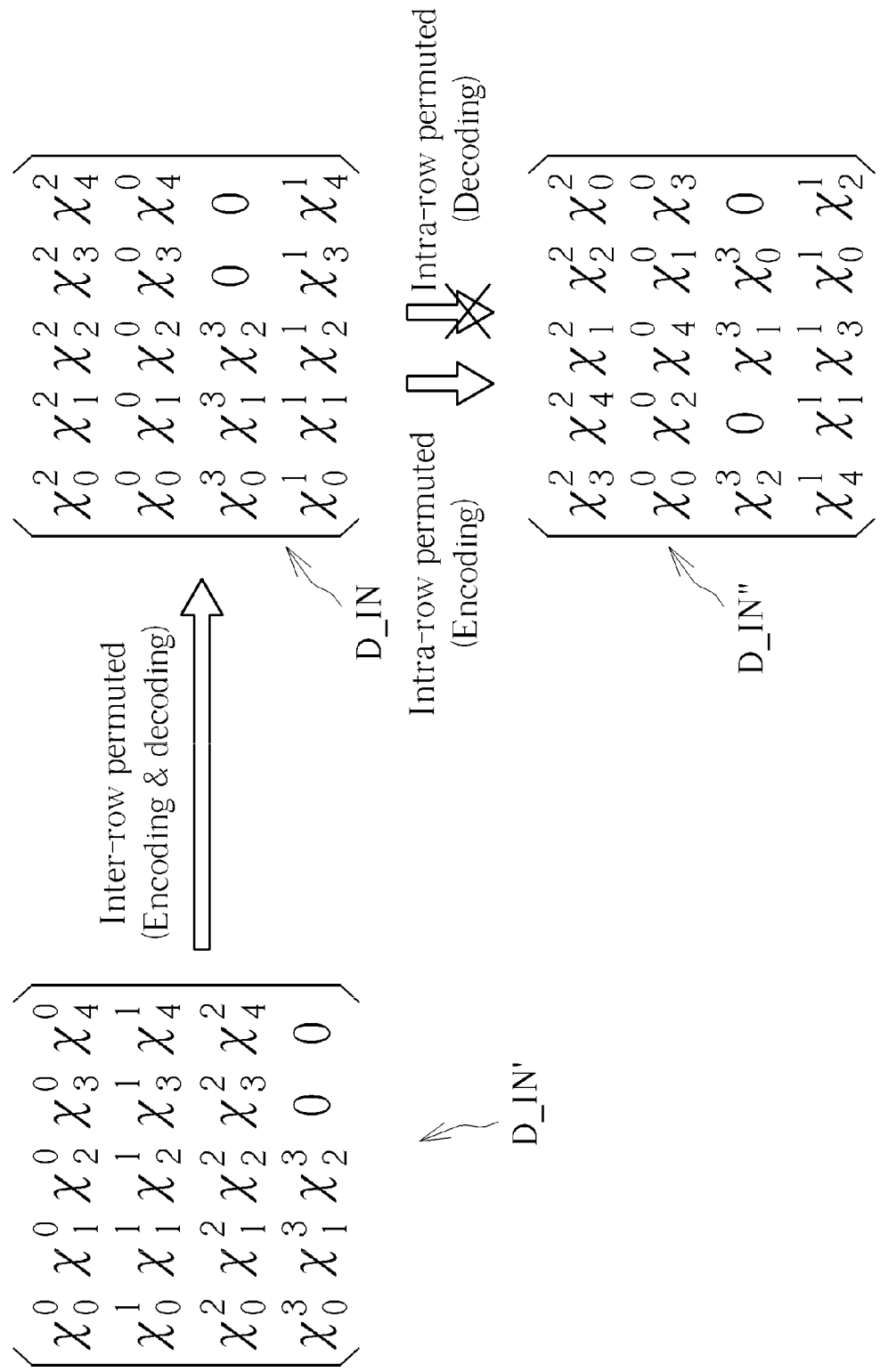
FIG. 2 is a diagram illustrating an example of the interleaved memory arrangement employed by the decoding apparatus shown in FIG. 1.

Please refer to FIG. 2, which is a diagram illustrating an example of the interleaved memory arrangement employed by the decoding apparatus 100 shown in FIG. 1. Suppose that an information block (e.g., a data block D_IN' shown in FIG. 2) is encoded at an encoding apparatus (e.g., a turbo encoding apparatus) and then transmitted to a decoding apparatus (e.g., a turbo decoding apparatus) for decoding. Regarding one turbo encoding procedure for the data block D_IN', the data block D_IN' is processed by one turbo encoder in a row-by-row sequence. As shown in FIG. 2, the data block D_IN' includes a plurality of data bits $\chi_0^0$-$\chi_4^0$, $\chi_0^1$-$\chi_4^1$, $\chi_0^2$-$\chi_4^2$, $\chi_0^3$-$\chi_2^3$ located at successive data rows, respectively. Thus, the data bits $\chi_0^0$-$\chi_4^0$, $\chi_0^1$-$\chi_4^1$, $\chi_0^2$-$\chi_4^2$, $\chi_0^3$-$\chi_2^3$ are read in order and then processed by the turbo encoder to generate the aforementioned first parity bits.

Regarding another turbo encoding procedure for the data block D_IN', the data block D_IN' is processed by an interleaver (e.g., a rectangular interleaver) to become an interleaved data block D_IN", and then the interleaved data block D_IN" is processed by another turbo encoder in a column-by-column sequence. As shown in FIG. 2, inter-row permutation is applied to all data rows in the data block D_IN', and then intra-row permutation is applied to each data row of the data block D_IN. Specifically, regarding the inter-row permutation, the first data row in the data block D_IN' becomes the second data row in the data block D_IN, the second data row in the data block D_IN' becomes the fourth data row in the data block D_IN, the third data row in the data block D_IN' becomes the first data row in the data block D_IN, and the fourth data row in the data block D_IN' becomes the third data row in the data block D_IN. Regarding the intra-row permutation, the data bits $\chi_0^2$-$\chi_4^2$ in the first row of the data block D_IN are interleaved to become data bits $\chi_3^2, \chi_4^2, \chi_1^2, \chi_2^2, \chi_0^2$ in the first row of the data block D_IN", the data bits $\chi_0^0$-$\chi_4^0$ in the second row of the data block D_IN are interleaved to become data bits $\chi_0^0, \chi_2^0, \chi_4^0, \chi_1^0, \chi_3^0$ in the second row of the data block D_IN", the data bits $\chi_0^3$-$\chi_2^3$ and padded dummy bits '0' in the third row of the data block D_IN are interleaved to become bits $\chi_2^3, 0, \chi_1^3, \chi_0^3, 0$ in the third row of the data block D_IN", and the data bits $\chi_0^1$-$\chi_4^1$ in the fourth row of the data block D_IN are interleaved to become data bits $\chi_4^1, \chi_1^1, \chi_3^1, \chi_0^1, \chi_2^1$ in the fourth row of the data block D_IN". Next, data bits $\chi_3^2$-$\chi_4^1$ in the first column of the data block D_IN", data bits $\chi_4^2$-$\chi_1^1$ in the second column of the data block D_IN" (dummy bits omitted), data bits $\chi_1^2$-$\chi_3^1$ in the third column of the data block D_IN", data bits $\chi_2^2$-$\chi_0^1$ in the fourth column of the data block D_IN", and data bits $\chi_0^2$-$\chi_2^1$ in the fifth column of the data block D_IN" (dummy bits omitted) are read in order and then processed by a turbo encoder to generate the aforementioned second parity bits.

The systematic bits of the data block D_IN' and the associated first and second parity bits are transmitted from a transmitter end of a communications system (e.g., a W-CDMA system) to a receiver end of the communications system. Regarding the turbo decoding procedure performed at the receiver end, soft decisions (soft bits) corresponding to the received data block D_IN' undergoes inter-row permutation before stored into the memory device 102 shown in FIG. 1. It should be noted that no intra-row permutation is applied to each data row. For example, the memory device 102 has four memory banks. Thus, soft bits corresponding to data row $[\chi_0^2 \chi_1^2 \chi_2^2 \chi_3^2 \chi_4^2]$ of the data block D_IN are stored in the first memory bank, soft bits corresponding to data row $[\chi_0^2 \chi_1^2 \chi_2^0 \chi_3^0 \chi_4^0]$ of the data block D_IN are stored in the second memory bank, soft bits corresponding to data row $[\chi_0^3 \chi_1^3 \chi_2^3 \, 0 \, 0]$ of the data block D_IN are stored in the third memory bank, and soft bits corresponding to data row $[\chi_0^1 \chi_1^1 \chi_2^1 \chi_3^1 \chi_4^1]$ of the data block D_IN are stored in the fourth memory bank. The first decoder 104 is used for referring to the first parity bits to decode data bits $\chi_0^0$-$\chi_2^3$ in a successive bit sequence. However, as the memory device 102 stores a data block with permuted data rows, the first decoder 104 is therefore arranged for accessing the memory device 102 to perform a first decoding operation with inter-row de-interleaving memory access. More specifically, the first decoder 104 does not sequentially access the memory banks in a row-by-row sequence due to the fact that the memory device 102 has an inter-row permuted arrangement of data rows. Thus, when performing the first decoding operation according to the first parity bits, the first decoder 104 accesses the second memory bank, the fourth memory bank, the first memory bank and the third memory bank, sequentially. In this way, data bits $\chi_0^0$-$\chi_4^0$, $\chi_0^1$-$\chi_4^1$, $\chi_0^2$-$\chi_4^2$ and $\chi_0^3$-$\chi_2^3$ are sequentially read and then processed by the first decoder 104 for error detection and correction. To put it simply, the first decoder 104 shares the inter-row de-interleaving effort due to the interleaved memory arrangement for data bits (e.g., soft bits) to be decoded.

Further, as the memory device 102 stores a data block with data rows that are inter-row permuted only, the second decoder 106 is arranged for accessing the memory device 102 to perform a second decoding operation with intra-row de-interleaving memory access. More specifically, due to the fact that the memory device 102 does not have an intra-row permuted arrangement for each data row, the second decoder 106 does not read across different memory banks in a column-by-column sequence for sequentially fetching soft bits located at the same column but different memory banks. Thus, when performing the second decoding operation according to the second parity bits, the second decoder 106 successively accesses the first memory bank to the fourth memory bank for getting desired soft bits, including the fourth data bit $\chi_4^1$ from the first memory bank, the first data bit $\chi_0^0$ from the second memory bank, the third data bit $\chi_2^3$ from the third memory bank, and the fifth data bit $\chi_4^1$ from the fourth memory bank. Next, the second decoder 106 successively accesses the first memory bank, the second memory bank and the fourth memory bank for getting desired soft bits, including the fifth data bit $\chi_4^2$ from the first memory bank, the third data bit $\chi_2^0$ from the second memory bank, and the second data bit $\chi_1^1$ from the fourth memory bank. The following memory access for remaining data bits may be deduced by analogy and thus omitted here for brevity. In this way, data bits $\chi_3^2$-$\chi_4^1$, $\chi_4^2$-$\chi_1^1$, $\chi_1^2$-$\chi_3^1$, $\chi_2^2$-$\chi_0^1$ and $\chi_0^2$-$\chi_2^1$ are successively read and then processed by the second decoder 106 for error detection and correction. To put it simply, the second decoder 104 shares the intra-row de-interleaving effort due to the interleaved memory arrangement for data bits (e.g., soft bits) to be decoded.

For clarity and simplicity, the rectangular interleaver design with four rows is shown in FIG. 2. However, this is merely an example for illustrating features of the present invention. In practice, the row number R of a rectangular interleaver may depend on the number of input bits K, as shown below.

$$R = \begin{cases} 5, & \text{if } (40 \le K \le 159) \\ 10, & \text{if } ((160 \le K \le 200) \text{ or } (481 \le K \le 530)) \\ 20, & \text{if } ((2281 \le K \le 2480) \text{ or } (3161 \le K \le 3210)) \\ 20, & \text{if } (K = \text{any other value}) \end{cases}$$

Thus, based on the setting of the row number R of the rectangular interleaver, the inter-row permutation would have pre-defined patterns as shown in the following table.

TABLE 1

| Number of input bits (K) | Number of Inter-row permutation patterns rows (R) | <T(0), T(1), . . . , T(R-1)> |
|---|---|---|
| 40 ≤ K ≤ 159 | 5 | <4, 3, 2, 1, 0> |
| (160 ≤ K ≤ 200) or (481 ≤ K ≤ 530) | 10 | <9, 8, 7, 6, 5, 4, 3, 2, 1, 0> |
| (2281 ≤ K ≤ 2480) or (3161 ≤ K ≤ 3210) | 20 | <19, 9, 14, 4, 0, 2, 5, 7, 12, 18, 16, 13, 17, 15, 3, 1, 6, 11, 8, 10> |
| K = any other value | 20 | <19, 9, 14, 4, 0, 2, 5, 7, 12, 18, 10, 8, 13, 17, 3, 1, 16, 6, 15, 11> |

Regarding the inter-row permutation patterns, T(i) represents the original row index of the permuted index i. Taking R=5 for example, a data row with an original row index '4' would become a data row with a permuted row index '0', a data row with an original row index '3' would become a data row with a permuted row index '1', a data row with an original row index '2' would become a data row with a permuted row index '2', a data row with an original row index '1' would become a data row with a permuted row index '3', and a data row with an original row index '0' would become a data row with a permuted row index '4'. Hence, after the inter-row permutation is applied to data rows of an original data block, an adjusted data block would have data rows arranged in a reverse order. As a person skilled in the art can readily understand details of the rectangular interleaver, further description is omitted here for brevity.

In one exemplary design, the second decoder 106 is configured to have M decoder cores used for parallel decoding, where each of the M decoder cores is arranged for decoding N data bits per cycle, and M and N are positive integers. The M decoder cores are expected to divide the decoding time by a factor of M, thereby increasing the throughput. Regarding the memory device 102, it is configured to have multiple memory banks for storing the data rows. Besides, the inter-row interleaving is properly configured to ensure that at least M*N valid data bits are always obtained through simultaneously accessing the memory banks. In one exemplary turbo decoder design, M=4 and N=2. Thus, the second decoder 106 is a quad-core decoder, and each decoder core of the quad-core decoder is a radix-4 MAP core/engine implemented to decode a codeword segment composed of 2 soft bits per cycle.

In a case where each decoder core 116 in the second decoder 106 is a radix-4 MAP core implemented to decode two soft bits per cycle (i.e., M=4 and N=2), the memory device 102 is preferably configured to meet the requirement for an 8/10 property. Thus, the memory device 102 would have 10 memory banks rather than 8 memory banks. As mentioned above, there may be dummy bits added to fit the interleaver size. Hence, when 10 memory banks are employed, the interleaved arrangement of the soft bits can make each of the 4 decoder cores 116 always get 8 valid soft bits through simultaneously accessing the 10 memory banks. Specifically, for any 10 consecutive interleaved bits (which may include dummy bit(s)) read across the 10 memory banks, the 8/10 property can be fulfilled with the inter-row permutation. To put it simply, the 4 decoder cores 116 are arranged to access the memory device 102 in a round-robin manner, where each decoder core 116 obtains at least 8 valid bits in one memory access cycle. That is, each decoder core 116 can always read at least 8 soft bits of the systematic information from the 10 memory banks 112 in the memory device 102. As each decoder core 116 would read all memory banks 112 on its turn whenever there are less than 8 soft bits to last for the next 4 cycles, the row swapping is accommodated by the current memory access which reads all memory banks. This avoids separating two swapped rows in two memory accesses as well as the extra buffer and delay required to finish the row swapping.

Based on the above-mentioned table showing possible inter-row permutation patterns for different row numbers of the rectangular interleaver, the 10 memory banks would be used to store data rows interleaved due to inter-row permutation. The distribution of the inter-row permuted rows for different row numbers of the rectangular interleaver is illustrated in the following table.

TABLE 2

| Bank # | R = 5 | R = 10 | R = 20 | R = 20 |
|---|---|---|---|---|
| 0 | 4 | 9 | 19, 16 | 19, 10 |
| 1 | 3 | 8 | 9, 13 | 9, 8 |
| 2 | 2 | 7 | 14, 17 | 14, 13 |
| 3 | 1 | 6 | 4, 15 | 4, 17 |
| 4 | 0 | 5 | 0, 3 | 0, 3 |
| 5 |   | 4 | 2, 1 | 2, 1 |
| 6 |   | 3 | 5, 6 | 5, 16 |
| 7 |   | 2 | 7, 11 | 7, 6 |
| 8 |   | 1 | 12, 8 | 12, 15 |
| 9 |   | 0 | 18, 10 | 18, 11 |

Figure 3:
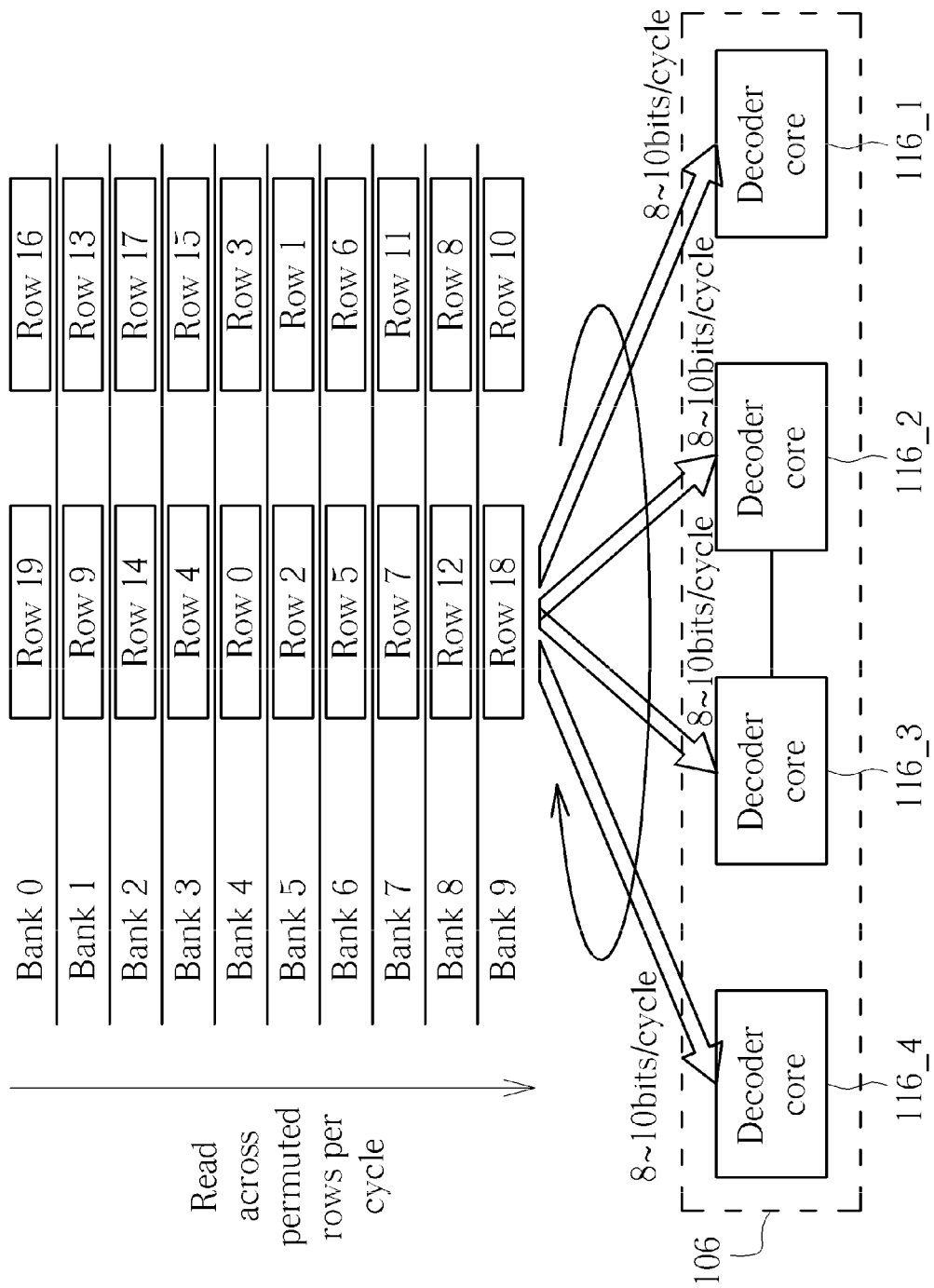
FIG. 3 is a diagram illustrating a memory access order of four decoder cores in the second decoder according to an embodiment of the present invention.
Figure 4:
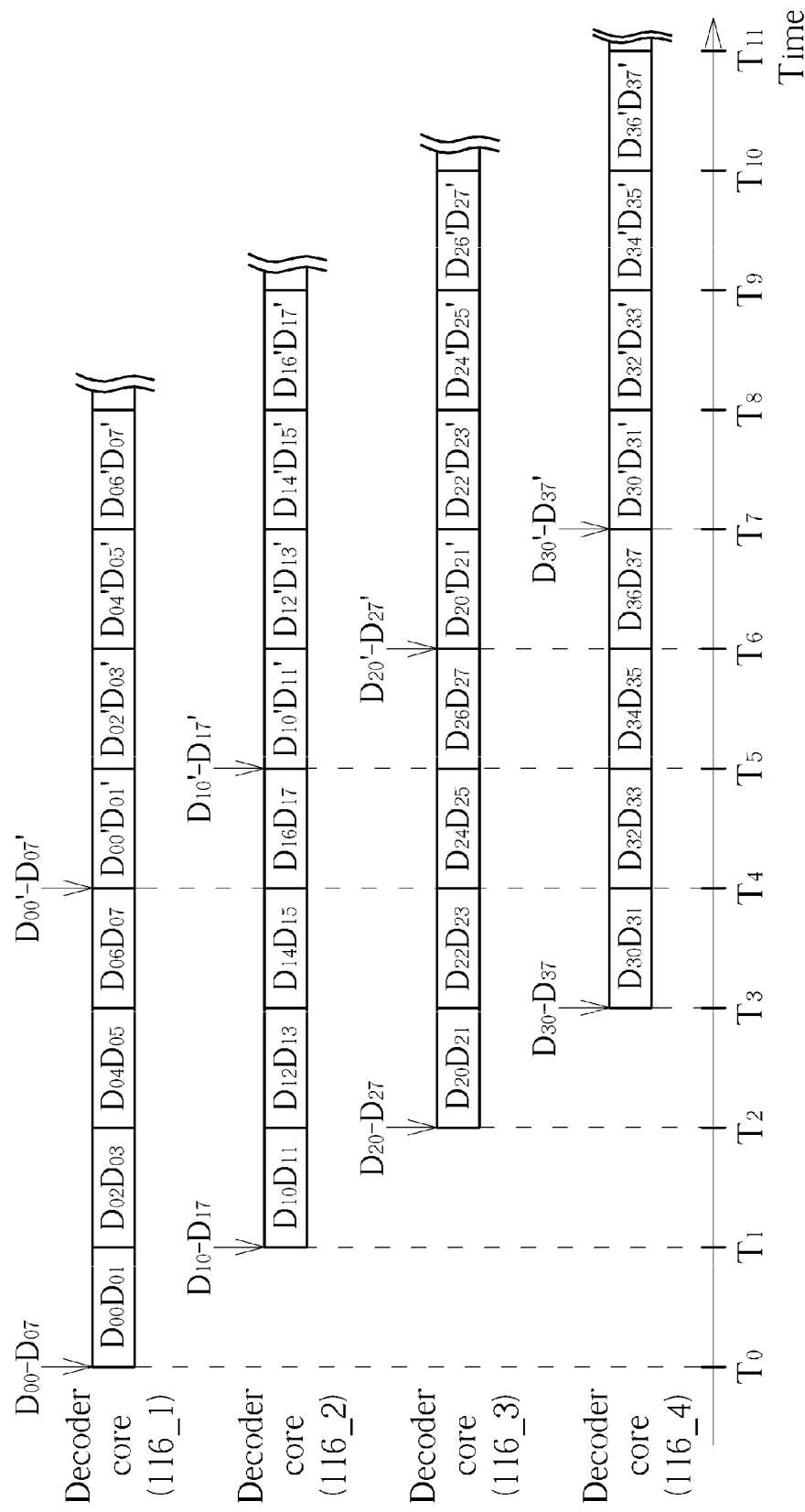
FIG. 4 is a timing diagram of the parallel decoding operation performed by four decoder cores in the second decoder according to an embodiment of the present invention.

Please refer to FIG. 3 in conjunction with FIG. 4 for better understanding of technical features of the present invention. FIG. 3 is a diagram illustrating a memory access order of four decoder cores in the second decoder 106 according to an embodiment of the present invention. FIG. 4 is a timing diagram of the parallel decoding operation performed by the four decoder cores in the second decoder 106 according to an embodiment of the present invention. Consider an exemplary case where 8 valid data bits are available in the memory device 102 for each memory access. It should be noted that this is for illustrative purposes only, and is not meant to be a limitation of the present invention. Therefore, the decoder cores 116_1, 116_2, 116_3 and 116_4 of the second decoder 106 take turns to obtain 8 data bits (e.g., soft bits) from the memory device 102, where 20 data rows of a data block are stored in 10 memory banks in an inter-row permuted fashion. Hence, when one of the decoder cores 116_1-116_4 is granted to access the memory device 102, the required 8 data bits would be located at different memory banks, respectively. In this way, each of the decoder cores 116_1-116_4 is capable of getting the required 8 data bits in one memory access cycle by simultaneously reading 8 memory banks selected from the 10 memory banks of the memory device 102. As can be seen from FIG. 4, the decoder core 116_1 simultaneously gets 8 data bits $D_{00}$-$D_{07}$ at $T_0$, decodes first two data bits $D_{00}$ and $D_{01}$ in one cycle between $T_0$ and $T_1$, decodes next two data bits $D_{02}$ and $D_{03}$ in one cycle between $T_1$ and $T_2$, decodes next two data bits $D_{04}$ and $D_{05}$ in one cycle between $T_2$ and $T_3$, and decodes last two data bits $D_{06}$ and $D_{07}$ in one cycle between $T_3$ and $T_4$. After the data bits $D_{00}$-$D_{07}$ have been completely decoded during 4 cycles, the decoder core 116_1 simultaneously gets the next 8 data bits $D_{00}'$-$D_{07}'$ at $T_4$, decodes first two data bits $D_{00}'$ and $D_{01}'$ in one cycle between $T_4$ and $T_5$, decodes next two data bits $D_{02}'$ and $D_{03}'$ in one cycle between $T_5$ and $T_6$, decodes next two data bits $D_{04}'$ and $D_{05}'$ in one cycle between $T_6$ and $T_7$, and decodes last two data bits $D_{06}'$ and $D_{07}'$ in one cycle between $T_7$ and $T_8$. Therefore, as the decoder core 116_1 gets 8 data bits simultaneously and decodes two data bits per cycle, the decoder core 116_1 only needs to access the memory device 102 every four cycles. Similarly, as can be seen from FIG. 4, each of the remaining decoder cores 116_2-116_4 only needs to access the memory device 102 every four cycles. However, when one decoder core is accessing the memory device 102 in a current cycle, the other decoder cores would not access the memory device 102 since the data bits to be decoded have been fetched in previous cycles. Hence, the decoder cores 116_1-116_4 of the second decoder 106 would have contention-free memory access of the memory device 102.

Please note that the decoder cores 116_1-116_4 are granted to access the memory device 102 at different cycles. Thus, each of the decoder cores 116_1-116_4 can be selectively used for computing forward metrics α first or backward metrics β first, where the forward metrics and the backward metrics are both computed by each decoder core in the current operation to facilitate the window-based approximation utilized in the later operation for next round of iteration. More specifically, properly having interleaved decoding directions for the current operation can bring better initial forward and backward metrics for the window-based approximation in the later operation. In this way, with a proper decoding direction setting of the decoder cores 116_1-116_4, full-trace decoding may be achieved by using the second decoder 106.

Regarding the first decoder 104, it may include M' decoder cores used for parallel decoding, where each of the M' decoder cores is arranged for decoding N' data bits per cycle. Besides, the M' decoder cores are categorized into K' decoder core groups, where each decoder core group contains M'/K' decoder cores, and M', N' and K' are positive integers. Besides, the K' decoder core groups are arranged to access the memory device 102 in a round-robin manner. As the memory device 102 has multiple memory banks for storing the data rows, the inter-row interleaving is properly configured to ensure that all decoder cores 114 in each decoder core group do not access the same memory bank simultaneously. In one exemplary turbo decoder design, M'=M=4, N'=N=2, K'=2, and the number of memory banks is equal to 10. Therefore, the first decoder 104 is a quad-core decoder, and each decoder core of the first decoder 104 is a radix-4 MAP core/engine implemented to decode two data bits (e.g., soft bits) per cycle. As the first decoder 104 has two decoder core groups each having two decoder cores, and the two decoder core groups are arranged to access the memory device 102 in a round-robin manner, each decoder core 114 of the first decoder 104 is configured to get 4 valid data bits. In this embodiment, the 4 valid data bits are consecutive data bits that are packed together and read from the memory device 102. Thus, each decoder core of the first decoder 104 is capable of easily reading the desired 4 valid data bits from the memory device 102 in one memory access cycle. It should be noted that, compared to a pack-8 format, the proposed pack-4 format would have a good trade-off among access complexity, power and area.

When the pack-4 format is employed, only two decoder cores of the same decoder core group would access memory banks of the memory device 102 at the same time. In a case where the row number of the rectangular interleaver is 20 (i.e., R=20) and the first decoder 104 is a quad-core decoder, each decoder core 114 of the first decoder 104 is required to decode data bits located at five successive data rows. As the inter-row interleaving is properly configured to ensure that all decoder cores in each decoder core group do not access the same bank simultaneously, the decoder cores 114 of the first decoder 104 would have contention-free memory access of the memory device 102.

Figure 5:
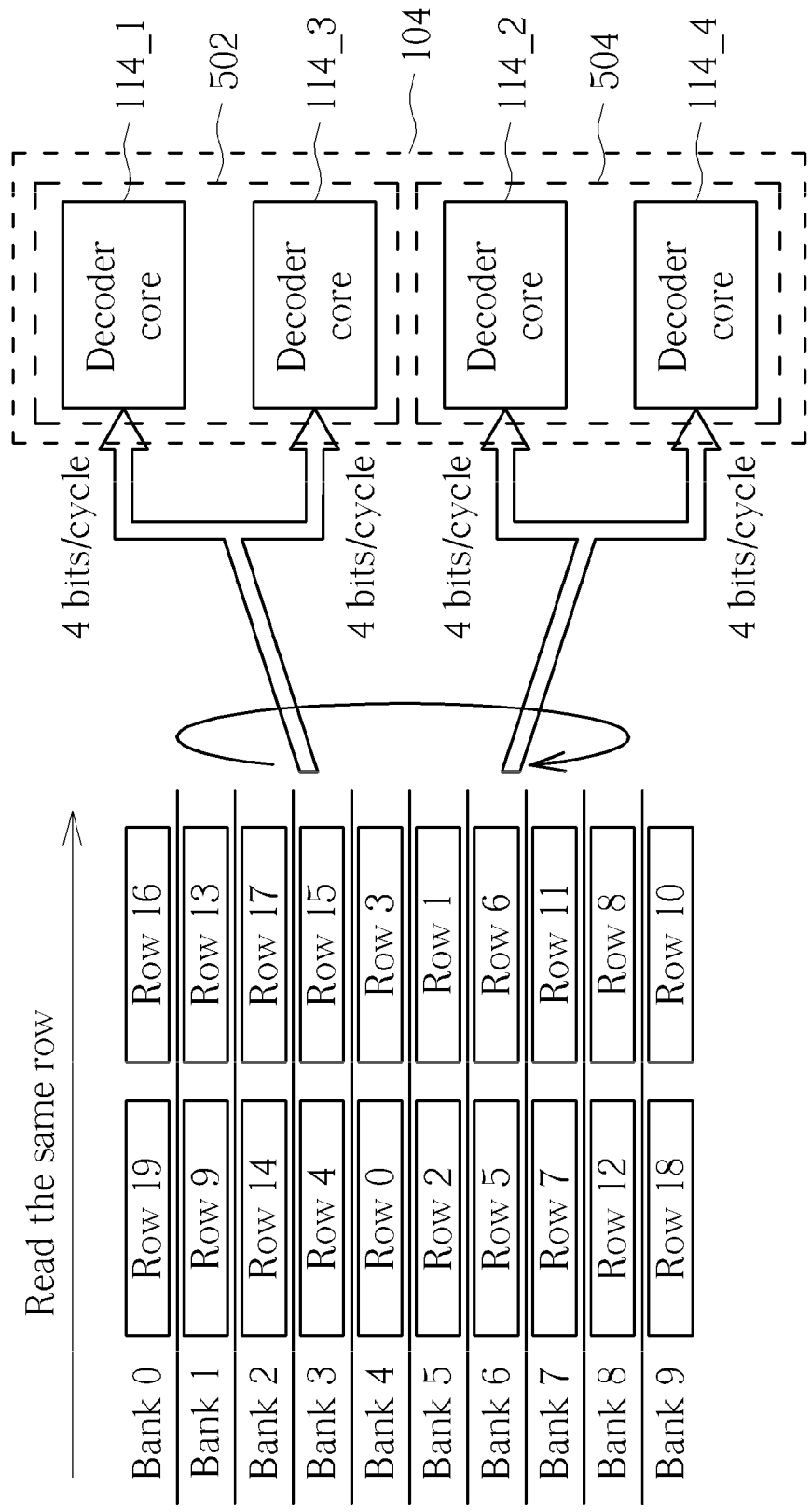
FIG. 5 is a diagram illustrating a memory access order of four decoder cores in the first decoder according to an embodiment of the present invention.
Figure 6:
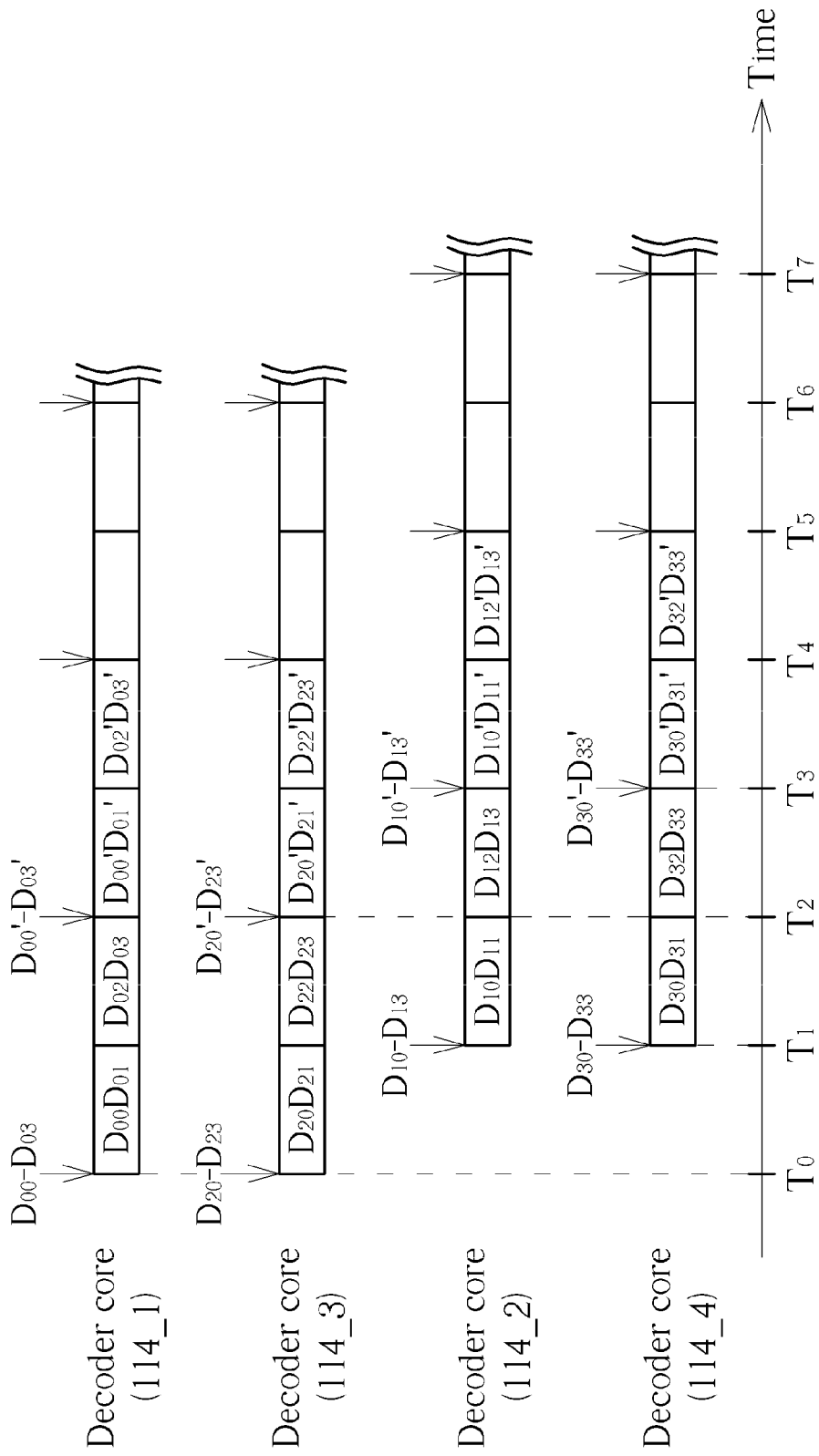
FIG. 6 is a timing diagram of the parallel decoding operation performed by four decoder cores in the first decoder according to an embodiment of the present invention.

Please refer to FIG. 5 in conjunction with FIG. 6 for better understanding of the technical features of the present invention. FIG. 5 is a diagram illustrating a memory access order of four decoder cores in the first decoder 104 according to an embodiment of the present invention. FIG. 6 is a timing diagram of the parallel decoding operation performed by the four decoder cores in the first decoder 104 according to an embodiment of the present invention. In this embodiment, the decoder cores 114_1 and 114_3 belong to one decoder core group 502, and the decoder cores 114_2 and 114_4 belong to the other decoder core group 504. The decoder core groups 502 and 504 take turns to obtain 8 data bits (e.g., soft bits) from the memory device 102, where each of the decoder core 114_1-114_4 is arranged to get 4 data bits when granted to access the memory device 102. As shown in FIG. 5, 20 data rows of a data block are stored in 10 memory banks in an inter-row permuted fashion. Hence, when one of the decoder cores 114_1-114_4 is granted to access the memory device 102, two data bits to be decoded in each cycle would be located at the same bank. Due to the pack-4 format employed, each of the decoder cores 114_1-114_4 is capable of getting the desired 4 data bits in one memory access cycle. As can be seen from FIG. 6, the decoder core 114_1 successively gets 4 data bits $D_{00}$-$D_{03}$ in one cycle between $T_0$ and $T_1$, and the decoder core 114_3 successively gets 4 data bits $D_{20}$-$D_{23}$ in one cycle between $T_0$ and $T_1$. Hence, the decoder core 114_1 decodes first two data bits $D_{00}$ and $D_{01}$ in one cycle between $T_0$ and $T_1$, and decodes last two data bits $D_{02}$ and $D_{03}$ in one cycle between $T_1$ and $T_2$. Similarly, the decoder core 114_3 decodes first two data bits $D_{20}$ and $D_{21}$ in one cycle between $T_0$ and $T_1$, and decodes last two data bits $D_{22}$ and $D_{23}$ in one cycle between $T_1$ and $T_2$. After the data bits $D_{00}$-$D_{03}$ have been completely decoded during two cycles, the decoder core 114_1 successively gets the next 4 data bits $D_{00}'$-$D_{03}'$ in one cycle between $T_2$ and $T_3$, decodes first two data bits $D_{00}'$ and $D_{01}'$ in one cycle between $T_2$ and $T_3$, and decodes last two data bits $D_{02}'$ and $D_{03}'$ in one cycle between $T_3$ and $T_4$. Similarly, after the data bits $D_{20}$-$D_{23}$ have been completely decoded during two cycles, the decoder core 114_3 successively gets the next 4 data bits $D_{20}'$-$D_{23}'$ in one cycle between $T_2$ and $T_3$, decodes first two data bits $D_{20}'$ and $D_{21}'$ in one cycle between $T_2$ and $T_3$, and decodes last two data bits $D_{22}'$ and $D_{23}'$ in one cycle between $T_3$ and $T_4$. As each of the decoder cores 114_1 and 114_3 of the same decoder core group 502 gets four data bits in each memory access and decodes two data bits per cycle, the decoder cores 114_1 and 114_3 only need to access the memory device 102 every two cycles. Similarly, as can be seen from FIG. 6, each of the decoder cores 114_2 and 114_4 of the same decoder core group 504 only need to access the memory device 102 every two cycles. However, when one decoder core group is accessing the memory device 102 in a current cycle, the other decoder core group would not access the memory device 102 because the data bits to be decoded have been fetched in the previous cycle. Thus, with the help of the inter-row permutation applied to the data rows stored in the memory banks, the decoder cores 114_1-114_4 of the first decoder 104 would have contention-free memory access of the memory device 102. Some examples are provided as below.

In a first case where the number of input bits K meets the criterion: (2281≤K≤2480) or (3161≤K≤3210), the corresponding inter-row permutation patterns for R=20, as shown in above Table 1, are adopted. Suppose that the 19$^{th}$ row and the 20$^{th}$ row (i.e., row 18 and row 19 shown in FIG. 5) are dummy rows composed of dummy bits. Hence, four decoder cores 114_1-114_4 are required to decode data bits of 18 data rows. In this embodiment, the decoder cores 114_1 and 114_3 of the decoder core group 502 are used for computing forward metrics α first, while the decoder cores 114_2 and 114_4 of the decoder core group 504 are used for computing backward metrics β first. In this way, full-trace decoding can be achieved by using the first decoder 104. By way of example, the decoder core 114_1 is configured to sequentially decode five rows including row 0 to row 4, the decoder core 114_2 is configured to sequentially decode five rows including row 8 to row 4, the decoder core 114_3 is configured to sequentially decode five rows including row 8 to row 12, and the decoder core 114_4 is configured to sequentially decode five rows including row 17 to row 13, where the first half of row 4 is decoded by the decoder core 114_1, and the remaining half of row 4 is decoded by the decoder core 114_2, and the first half of row 8 is decoded by the decoder core 114_2, and the remaining half of row 4 is decoded by the decoder core 114_3.

Please refer to FIG. 7 in conjunction with the aforementioned Table 2. FIG. 7 is a diagram illustrating the relation between data rows and memory banks according to a first embodiment of the present invention. Regarding the decoder core group 502, the decoder core 114_1 needs to access one of a plurality of memory banks, including banks 3, 4 and 5; and the decoder core 114_3 needs to access one of a plurality of memory banks, including banks 1, 7, 8 and 9. As the memory banks to be accessed by the decoder cores 114_1 and 114_3 in the same decoder core group 502 are mutually exclusive, the decoder cores 114_1 and 114_3 would have contention-free memory access of the memory device 102. Regarding the decoder core group 504, the decoder core 114_2 needs to access one of a plurality of memory banks, including banks 3, 6, 7 and 8; and the decoder core 114_4 needs to access one of a plurality of memory banks, including banks 0, 1, 2 and 3. As can be seen from FIG. 7, the decoder core 114_2 has to access bank 3 for decoding data bits of row 4, and the decoder core 114_4 has to access bank 3 for decoding data bits of row 15. It should be noted that row 4 is the fifth data row to be decoded by the decoder core 114_2, and row 15 is the third data row to be decoded by the decoder core 114_4. As the difference between the decoding order of row 4 and the decoding order of row 15 is not large enough, it is possible that the decoder core 114_2 starts decoding data bits of row 4 before the decoder core 114_4 finishes decoding data bits of row 15. To guarantee that the decoder cores 114_2 and 114_4 would not access the same memory bank (i.e., bank 3) at the same time, the synchronization control between the decoder cores 114_2 and 114_4 may be employed. In this way, the decoder cores 114_2 and 114_4 also have contention-free memory access of the memory device 102.

In an alternative design, the inter-row interleaving is configured to ensure that all decoder cores in each decoder core group do not access the same memory bank simultaneously, where regarding each decoder core group, banks storing data rows to be decoded by one decoder core are not accessed by other decoder core(s). The present invention thus proposes additional row swapping for the row assignment excluding dummy rows. The adjusted distribution of the inter-row permuted rows for different row numbers of the rectangular interleaver is illustrated in the following table.

TABLE 3

| Bank # | R = 5 | R = 10 | R = 20 | R = 20 |
|---|---|---|---|---|
| 0 | 4 | 9 | 19, 16 | 19, 10 |
| 1 | 3 | 8 | 9, 13 | 9, 8 |
| 2 | 2 | 7 | 14, 17 | 14, 13 |
| 3 | 1 | 6 | 0, 15 | 4, 17 |
| 4 | 0 | 5 | 4, 3 | 0, 3 |
| 5 |   | 4 | 2, 1 | 2, 16 |
| 6 |   | 3 | 5, 6 | 5, 1 |
| 7 |   | 2 | 7, 11 | 7, 6 |
| 8 |   | 1 | 12, 8 | 12, 15 |
| 9 |   | 0 | 18, 10 | 18, 11 |

Compared to above Table 2, Table 3 has row 0 stored in bank 3 and row 4 stored in bank 4 for R=20 under the condition where (2281≤K≤2480) or (3161≤K≤3210), and has row 16 stored in bank 5 and row 1 stored in bank 6 for R=20 under the another condition where K=any other value. Please refer to FIG. 8 in conjunction with aforementioned Table 3. FIG. 8 is a diagram illustrating the relation between data rows and memory banks according to a second embodiment of the present invention. Based on the row assignment as shown in Table 3, the memory banks to be accessed by the decoder cores 114_1 and 114_3 in the same decoder core group 502 are mutually exclusive, and the memory banks to be accessed by the decoder cores 114_2 and 114_4 in the same decoder core group 502 are also mutually exclusive. Such an exclusive memory access design can omit the complex synchronization control between decoder cores in the same decoder core group.

In a second case where the number of input bits K meets the criterion: K=any other value, the corresponding inter-row permutation patterns for R=20, as shown in above Table 1, are adopted. Suppose that the 19th row and the 20th row (i.e., row 18 and row 19 shown in FIG. 5) are dummy rows composed of dummy bits. Hence, four decoder cores 114_1-114_4 are required to decode data bits of 18 data rows. In this embodiment, the decoder cores 114_1 and 114_3 of the decoder core group 502 are used for computing forward metrics α first, while the decoder cores 114_2 and 114_4 of the decoder core group 504 are used for computing backward metrics β first. Similarly, full-trace decoding is achieved by using the first decoder 104 in this embodiment. By way of example, the decoder core 114_1 is configured to sequentially decode five rows including row 0 to row 4, the decoder core 114_2 is configured to sequentially decode five rows including row 8 to row 4, the decoder core 114_3 is configured to sequentially decode five rows including row 8 to row 12, and the decoder core 114_4 is configured to sequentially decode five rows including row 17 to row 13, where the first half of row 4 is decoded by the decoder core 114_1, and the remaining half of row 4 is decoded by the decoder core 114_2, and the first half of row 8 is decoded by the decoder core 114_2, and the remaining half of row 4 is decoded by the decoder core 114_3.

Please refer to FIG. 9 in conjunction with the aforementioned Table 2. FIG. 9 is a diagram illustrating the relation between data rows and memory banks according to a third embodiment of the present invention. The row assignment for R=20 under the condition where K=any other value, as shown in Table 2, is employed. Therefore, regarding the decoder core group 502, the decoder core 114_1 needs to access one of a plurality of memory banks, including banks 3, 4 and 5; and the decoder core 114_3 needs to access one of a plurality of memory banks, including banks 0, 1, 8 and 9. As the memory banks to be accessed by the decoder cores 114_1 and 114_3 in the same decoder core group 502 are mutually exclusive, the decoder cores 114_1 and 114_3 would have contention-free memory access of the memory device 102.

Regarding the decoder core group 504, the decoder core 114_2 needs to access one of a plurality of memory banks, including banks 1, 3, 6 and 7; and the decoder core 114_4 needs to access one of a plurality of memory banks, including banks 2, 3, 6 and 8. As can be seen from FIG. 9, the decoder core 114_2 has to access bank 3 for decoding data bits of row 4, and the decoder core 114_4 has to access bank 3 for decoding data bits of row 17. Besides, the decoder core 114_2 has to access bank 6 for decoding data bits of row 5, and the decoder core 114_4 has to access bank 6 for decoding data bits of row 16. It should be noted that row 4 is the fifth data row to be decoded by the decoder core 114_2, and row 17 is the first data row to be decoded by the decoder core 114_4. As the difference between the decoding order of row 4 and the decoding order of row 17 is large, it is possible that the decoder core 114_2 starts decoding data bits of row 4 after the timing that the decoder core 114_4 finishes decoding data bits of row 17. Hence, the decoder cores 114_2 and 114_4 would not access the same memory bank (i.e., bank 3) at the same time. However, row 5 is the fourth data row to be decoded by the decoder core 114_2, and row 16 is the second data row to be decoded by the decoder core 114_4. As the difference between the decoding order of row 5 and the decoding order of row 16 is not large enough, it is possible that the decoder core 114_2 starts decoding data bits of row 5 before the decoder core 114_4 finishes decoding data bits of row 16. To guarantee that the decoder cores 114_2 and 114_4 would not access the same memory bank (i.e., bank 6) at the same time, the synchronization control between the decoder cores 114_2 and 114_4 may be employed. In this way, the decoder cores 114_2 and 114_4 also have contention-free memory access of the memory device 102.

Please refer to FIG. 10 in conjunction with the aforementioned Table 3. FIG. 10 is a diagram illustrating the relation between data rows and memory banks according to a fourth embodiment of the present invention. The row assignment for R=20 under the condition where K=any other value, as shown in Table 3, is employed. As can be seen from FIG. 10, the memory banks to be accessed by the decoder cores 114_1 and 114_3 in the same decoder core group 502 are mutually exclusive. Hence, the decoder cores 114_1 and 114_3 would have contention-free memory access of the memory device 102. Regarding the decoder core group 504, the decoder core 114_2 has to access bank 3 for decoding data bits of row 4, and the decoder core 114_4 has to access bank 3 for decoding data bits of row 17. It should be noted that row 4 is the fifth data row to be decoded by the decoder core 114_2, and row 17 is the first data row to be decoded by the decoder core 114_4. As the difference between the decoding order of row 4 and the decoding order of row 17 is large, it is possible that the decoder core 114_2 starts decoding data bits of row 4 after the decoder core 114_4 finishes decoding data bits of row 17. Hence, the decoder cores 114_2 and 114_4 would not access the same memory bank (i.e., bank 3) at the same time. In this way, the decoder cores 114_2 and 114_4 also have contention-free memory access of the memory device 102.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding apparatus, comprising:
   a memory device, arranged for storing a data block with inter-row interleaving in a plurality of data rows of the data block and without intra-row interleaving in each of the data rows; and
   a decoding circuit, coupled to the memory device, the decoding circuit arranged for accessing the memory device to perform a first decoding operation with inter-row de-interleaving memory access, and accessing the memory device to perform a second decoding operation with intra-row de-interleaving memory access.

2. The decoding apparatus of claim 1, wherein the decoding circuit comprises M decoder cores used for parallel decoding when performing the second decoding operation, where each of the M decoder cores is arranged for decoding N data bits per cycle, and M and N are positive integers; the memory device comprises a plurality of memory banks for storing the data rows; and the inter-row interleaving is configured to ensure that at least M*N valid data bits are always obtained through simultaneously accessing the memory banks.

3. The decoding apparatus of claim 2, wherein M=4, N=2, and a number of the memory banks is equal to 10.

4. The decoding apparatus of claim 2, wherein the M decoder cores access the memory device in a round-robin manner.

5. The decoding apparatus of claim 4, wherein each of the M decoder cores obtains M*N valid data bits in one cycle.

6. The decoding apparatus of claim 1, wherein the decoding circuit comprises M' decoder cores used for parallel decoding when performing the first decoding operation; the M' decoder cores are categorized into K' decoder core groups, each having M'/K' decoder cores, where M' and K' are positive integers; and the K' decoder core groups access the memory device in a round-robin manner.

7. The decoding apparatus of claim 6, wherein each of the M' decoder cores is arranged for obtaining K'*N' valid data bits from the memory device in one cycle and decoding N' data bits per cycle, where N' is a positive integer; and the K'*N' valid data bits are consecutive data bits that are packed together and read from the memory device.

8. The decoding apparatus of claim 7, wherein M'=4, N'=2 and K'=2.

9. The decoding apparatus of claim 6, wherein the memory device comprises a plurality of memory banks for storing the data rows; and the inter-row interleaving is configured to ensure that all decoder cores in each decoder core group do not access a same memory bank simultaneously.

10. The decoding apparatus of claim 9, wherein banks that store data rows to be decoded by one decoder core in a decoder core group are not accessed by other decoder core(s) in the decoder core group.

11. The decoding apparatus of claim 1, wherein the decoding apparatus is a turbo decoder, and the decoding circuit has multiple maximum a-posteriori probability (MAP) cores for performing each of the first decoding operation and the second decoding operation.

12. A decoding method, comprising:
    utilizing a memory device to store a data block with inter-row interleaving in a plurality of data rows of the data block and without intra-row interleaving in each of the data rows;
    performing a first decoding operation with inter-row de-interleaving memory access by accessing the memory device; and
    performing a second decoding operation with intra-row de-interleaving memory access by accessing the memory device.

13. The decoding method of claim 12, wherein the second decoding operation is performed by M decoder cores used for parallel decoding, where each of the M decoder cores is arranged for decoding N data bits per cycle, and M and N are positive integers; the memory device comprises a plurality of memory banks for storing the data rows; and the inter-row interleaving is configured to ensure that at least M*N valid data bits are always obtained through simultaneously accessing the memory banks.

14. The decoding method of claim 13, wherein M=4, N=2, and a number of the memory banks is equal to 10.

15. The decoding method of claim 13, wherein the step of performing the second decoding operation comprises:
    controlling the M decoder cores to access the memory device in a round-robin manner.

16. The decoding method of claim 15, wherein each of the M decoder cores obtains M*N valid data bits in one cycle.

17. The decoding method of claim 12, wherein the first decoding operation is performed by M' decoder cores used for parallel decoding; the M' decoder cores are categorized into K' decoder core groups, each having M'/K' decoder cores, where M' and K' are positive integers; and the step of performing the first decoding operation comprises:
    controlling the K' decoder core groups to access the memory device in a round-robin manner.

18. The decoding method of claim 17, wherein each decoder core in one decoder core group obtains K'*N' valid data bits from the memory device in one cycle and decodes N' data bits in one cycle, and the step of utilizing the memory device to store the data block comprises:
    packing consecutive data bits together to serve as the K'*N' valid data bits.

19. The decoding method of claim 18, wherein M'=4, N'=2 and K'=2.

20. The decoding method of claim 17, wherein the memory device comprises a plurality of memory banks for storing the data rows; and the step of utilizing the memory device to store the data block comprises:
    configuring the inter-row interleaving to ensure that all decoder cores in each decoder core group do not access a same memory bank simultaneously.

21. The decoding method of claim 20, wherein banks that store data rows to be decoded by one decoder core in a decoder core group are not accessed by other decoder core(s) in the decoder core group.

22. The decoding method of claim 12, wherein the decoding method is a turbo decoding method, and each of the first decoding operation and the second decoding operation is a parallel maximum a-posteriori probability (MAP) decoding operation.

* * * * *